United States Patent
Yeh (10) Patent No.: US 10,962,356 B2
(45) Date of Patent: Mar. 30, 2021

(54) METHOD FOR ESTIMATING THE SIMULATED CONTOUR OF A MATERIAL COMPOSED OF LONGITUDINAL AND TRANSVERSE LINE ELEMENTS

(71) Applicant: Shih-Hao Ray Yeh, Delta (CA)

(72) Inventor: Shih-Hao Ray Yeh, Delta (CA)

(*) Notice: Subject to any disclaimer, the term of this patent is extended or adjusted under 35 U.S.C. 154(b) by 135 days.

(21) Appl. No.: 16/289,576

(22) Filed: Feb. 28, 2019

(65) Prior Publication Data

US 2019/0316897 A1    Oct. 17, 2019

(30) Foreign Application Priority Data

Apr. 12, 2018  (TW) ................................ 107112634

(51) Int. Cl.
| | | |
|---|---|---|
| *G01B 11/24* | (2006.01) | |
| *G06T 7/13* | (2017.01) | |
| *G06T 7/70* | (2017.01) | |
| *G06T 7/60* | (2017.01) | |
| *H05K 3/00* | (2006.01) | |
| *H04N 5/247* | (2006.01) | |
| *H05K 3/46* | (2006.01) | |

(52) U.S. Cl.
CPC ............. *G01B 11/24* (2013.01); *G06T 7/13* (2017.01); *G06T 7/60* (2013.01); *G06T 7/70* (2017.01); *H04N 5/247* (2013.01); *H05K 3/0085* (2013.01); *G06T 2207/20164* (2013.01); *G06T 2207/30141* (2013.01); *H05K 3/4679* (2013.01); *H05K 2203/166* (2013.01)

(58) Field of Classification Search
CPC .. G01B 11/24; G06T 7/13; G06T 7/70; G06T 7/60; G06T 2207/20164; G06T 2207/30141; G06T 7/73; H05K 3/0085; H05K 3/4679; H05K 2203/166; H05K 2201/029; H05K 3/4652; H04N 5/247
See application file for complete search history.

(56) References Cited

U.S. PATENT DOCUMENTS

| | | | | |
|---|---|---|---|---|
| 6,466,340 | B1* | 10/2002 | Washio | .............. G06K 9/3283 358/488 |
| 2018/0286730 | A1* | 10/2018 | Yamakawa | ............ C25D 17/00 |
| 2019/0295291 | A1* | 9/2019 | Raag | ....................... G06T 7/80 |

FOREIGN PATENT DOCUMENTS

JP    2018168432    11/2018

* cited by examiner

*Primary Examiner* — Mohammed S Rahaman
(74) *Attorney, Agent, or Firm* — Bever, Hoffman & Harms, LLP (57) ABSTRACT

A method of estimating a virtual contour of an insulating material is disclosed. The method includes the following steps: obtaining a first and a second images at a pair of diagonal locations of the insulating material respectively; determining a first and a second corner locations from the first and the second images respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; and determining a first transverse axis direction, a first longitudinal axis direction, a second transverse axis direction and a second longitudinal axis direction based on these positions.

12 Claims, 6 Drawing Sheets

METHOD FOR ESTIMATING THE SIMULATED CONTOUR OF A MATERIAL COMPOSED OF LONGITUDINAL AND TRANSVERSE LINE ELEMENTS

CROSS-REFERENCE TO RELATED APPLICATION AND CLAIM OF PRIORITY

The application claims the benefit of Taiwan Patent Application No. 107112634, filed on Apr. 12, 2018, at the Taiwan Intellectual Property Office, the disclosures of which are incorporated herein in their entirety by reference.

FIELD OF THE INVENTION

The present invention is related to a method of estimating the simulated contour of a material, and more particularly to a method for estimating the simulated contour of a material composed of longitudinal and transverse line elements.

BACKGROUND OF THE INVENTION

The manufacturing process for fabricating printed circuit boards (PCB) includes steps of multi-layer stacking to stack conducting layers and insulating layers on each other and then pressing to integrate the layers. A common PCB manufacturing procedure is to start from a core substrate, subsequently attach metal conducting layers on both sides of the core substrates by means of stacking, perform pressing and etching on the metal conducting layers to form circuits, stack to attach insulating material on both sides of the core substrate with two circuit layers, and then repeat the aforementioned steps until the outer circuit layer is formed.

After years of technical innovation and improvement, the regular substrates and insulating materials usually take the form of sheets having a rectangular shape with longitudinal and transverse dimensions of about 20 to 30 inches while the thickness can be only a few millimeters or even less than one millimeter. The sizes of those materials are virtually the same. According to traditional stacking methods, the operators need to manually transport and place each sheet of the materials at the appropriate location based on visual inspections and personal experience, which significantly limits the production efficiency and causes variations in terms of quality. The manual operation for transportation and stacking can no longer satisfy the needs of the industry due to the large amount of market requirements and the rapidly reduced lead time.

Some PCB manufacturers tend to use a method of disposing markers at some specific locations on the materials and take advantage of visual identification by a computer to establish models of automatic transportation and stacking for production. However, these methods rely on the accuracy of the locations of the markers previously disposed on the surface of the materials, which can cause an increase in the production costs of the materials on the one hand. On the other hand, errors may occur if any inconsistency or deviation of locations among the markers exists on different batches of the materials made by the vendors. Therefore, there are technical issues to be resolved to avoid the above-mentioned problems.

SUMMARY OF THE INVENTION

The novel method of estimating a virtual contour of a material formed of longitudinal and transverse linear elements provided by the present invention records and identifies longitudinal or transverse end points via electronic image sensing devices, and determines the locations of each sides of the virtual contour based on locations of the end points without the need of location identification of predetermined markers. The present invention also can accurately, as well as in real-time, estimate the virtual contour to be used for consequent calculation of stacking locations, and therefore is an innovative technical breakthrough. Notably, the estimating for the virtual contour is performed by the method of computer simulation, i.e., software simulation can be adopted for estimating the contour of the material.

In accordance with one aspect of the present invention, a method of estimating a virtual contour of an insulating material is disclosed. The method comprises the following steps: obtaining a first and a second images at a pair of diagonal locations of the insulating material respectively; determining a first and a second corner locations from the first and the second images respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; determining a first transverse axis direction, a first longitudinal axis direction, a second transverse axis direction and a second longitudinal axis direction based on the first set of longitudinal end-point positions, the first set of transverse end-point positions, the second set of longitudinal end-point positions and the second set of transverse end-point positions respectively; and determining the virtual contour based on the first and the second longitudinal axis directions and the first and the second transverse axis directions.

In accordance with the other aspect of the present invention, a method of estimating a virtual contour of a sheet material formed of longitudinal and transverse linear elements is disclosed. The material has a rectangular shape with a longitudinal direction and a transverse direction and a pair of diagonal locations. The method comprises the following steps: obtaining a first and a second images at the pair of diagonal locations of the material respectively, wherein the first and the second images have a first and a second corner locations respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; and determining four sides of the rectangular shape to form the virtual contour based on the first set of longitudinal end-point positions, the first set of transverse end-point positions, the second set of longitudinal end-point positions and the second set of transverse end-point positions.

In accordance with another aspect of the present invention, a method of estimating a virtual contour of a sheet material formed of longitudinal and transverse linear elements is disclosed. The material has a rectangular shape with a longitudinal direction and a transverse direction and a pair of diagonal locations. The method comprises the following steps: obtaining a first and a second images at the pair of diagonal locations of the material respectively, wherein the first and the second images have a first and a second corner locations respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; and determining four sides of the rectangular shape to form the virtual contour based on the first set of longitudinal end-point positions, the first set of transverse end-point positions, the second set of longitudinal end-point positions and the second set of transverse end-point positions.

The aforementioned methods of estimating the virtual contour of material formed of longitudinal and transverse linear elements are applicable for automatically manufacturing multilayered printed circuit boards. Thus, the present invention has utility for industry.

The objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

Figure 1:
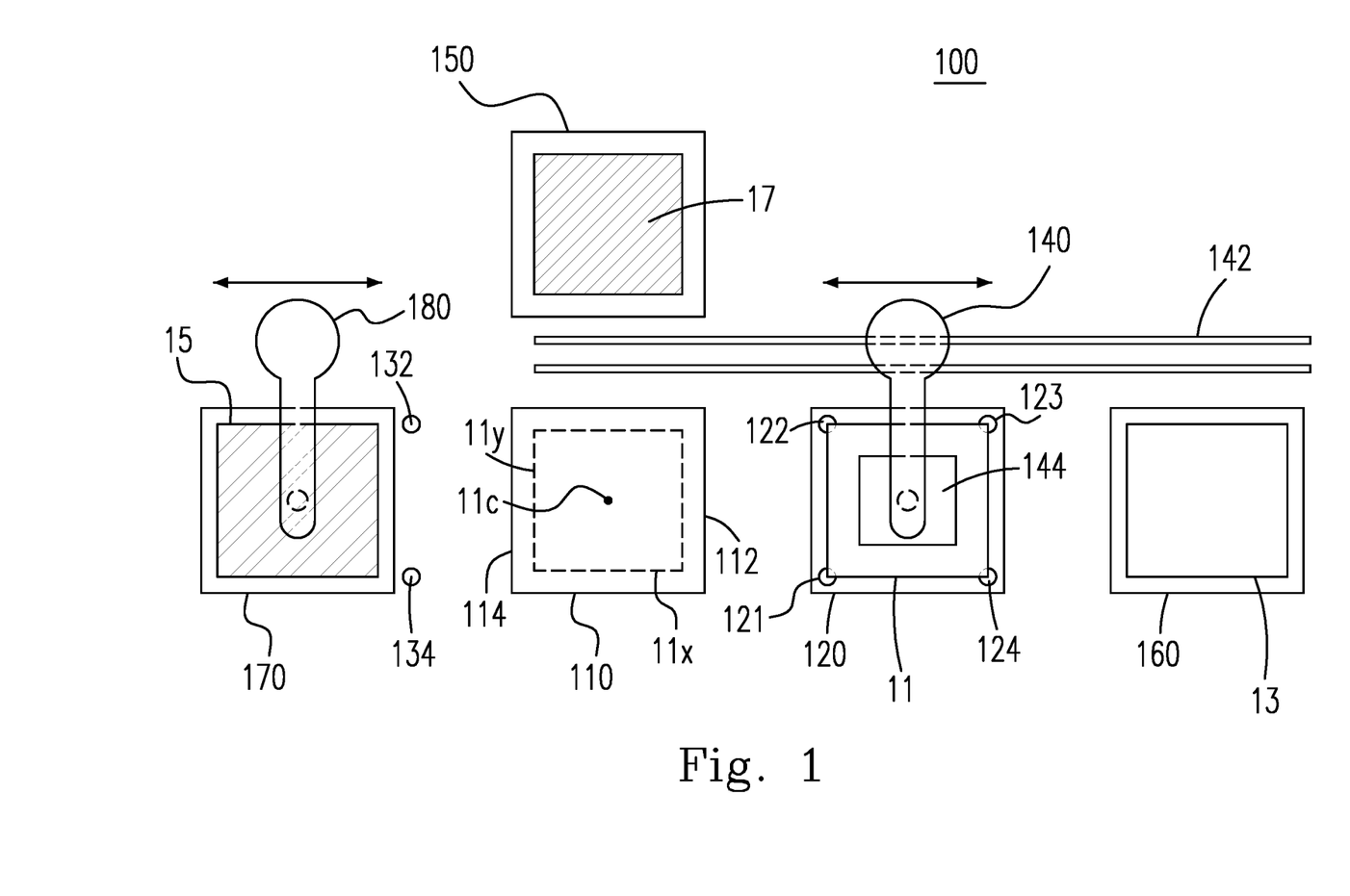
FIG. 1 is a schematic diagram showing a top view of the stacking and moving apparatus for manufacturing PCBs according to one embodiment of the present invention.

Please refer to FIG. 1, which shows a top view of the stacking and moving apparatus for manufacturing printed circuit boards (PCBs) according to one embodiment of the present invention. The stacking and moving apparatus 100 for manufacturing PCBs implements a stacking operation which disposes the first insulating material 11 and the second insulating material 13 on the upper and lower surfaces of the substrate material 15 respectively, by means of an automation process. The industry often uses the so-called prepreg material, which is formed of non-woven fiberglass fabric immersed in epoxy resin, as the insulating material in the layers of PCBs. However, the present invention also applies to the use of other types of insulating material. The outer shape of the first insulating material 11, the second insulating material 13 and the substrate material 15 are in general rectangular, and the size of each is close to that of the others. Thus, a multi-layer board structure can be formed by stacking those materials with precise alignments.

The mentioned substrate material 15 (or Core, according to the nomenclature in the PCB industry) at the initial production stage usually is formed of an insulating substrate in the middle with two copper sheets attached onto the two main surfaces of the insulating substrate, such as a composite plate with a sandwich structure. The surfaces with copper sheets will then be processed by etching or cutting to form predetermined circuits thereon. Afterward, sheet-like insulating materials or conducting materials are attached onto the two main surfaces consequently, and a multi-layered printed circuit board is formed. The present invention applies to the process of disposing insulating materials on both sides of the Core with conducting layers at the outer surface of the two sides, and the process of disposing conducting materials on both sides of the Core with insulating layers at the outer surface of the two sides as well.

In one embodiment of the present invention, the stacking and moving apparatus 100 for manufacturing PCBs includes a stacking operation table 110 and a measuring table 120 for performing image collection to the first and the second insulating materials 11, 13, which are usually large (some twenty to thirty inches in length as well as in width) sheets of prepreg and soft as paper. For the purpose of transporting these insulating materials 11, 13 efficiently and accurately, the stacking and moving apparatus 100 for manufacturing PCBs further includes a first transporting device 140, which is an automated moving device such as a robot or the like and (referring to FIG. 1, wherein the first transporting device 140 is disposed on the rail 142 and is movable between the tables) movably disposed at a position higher than the tables 110, 120 to transport the first and the second insulating materials 11, 13 from the insulating material storage location 160 to the first measuring table 120 and then to the stacking operation table 110 sequentially. The first transporting device 140 has a sucker 144, which can attach the transporting device 140 to the insulating materials 11, 13 at multiple locations by means of a vacuum device for transporting soft materials with large dimensions.

Figure 2:
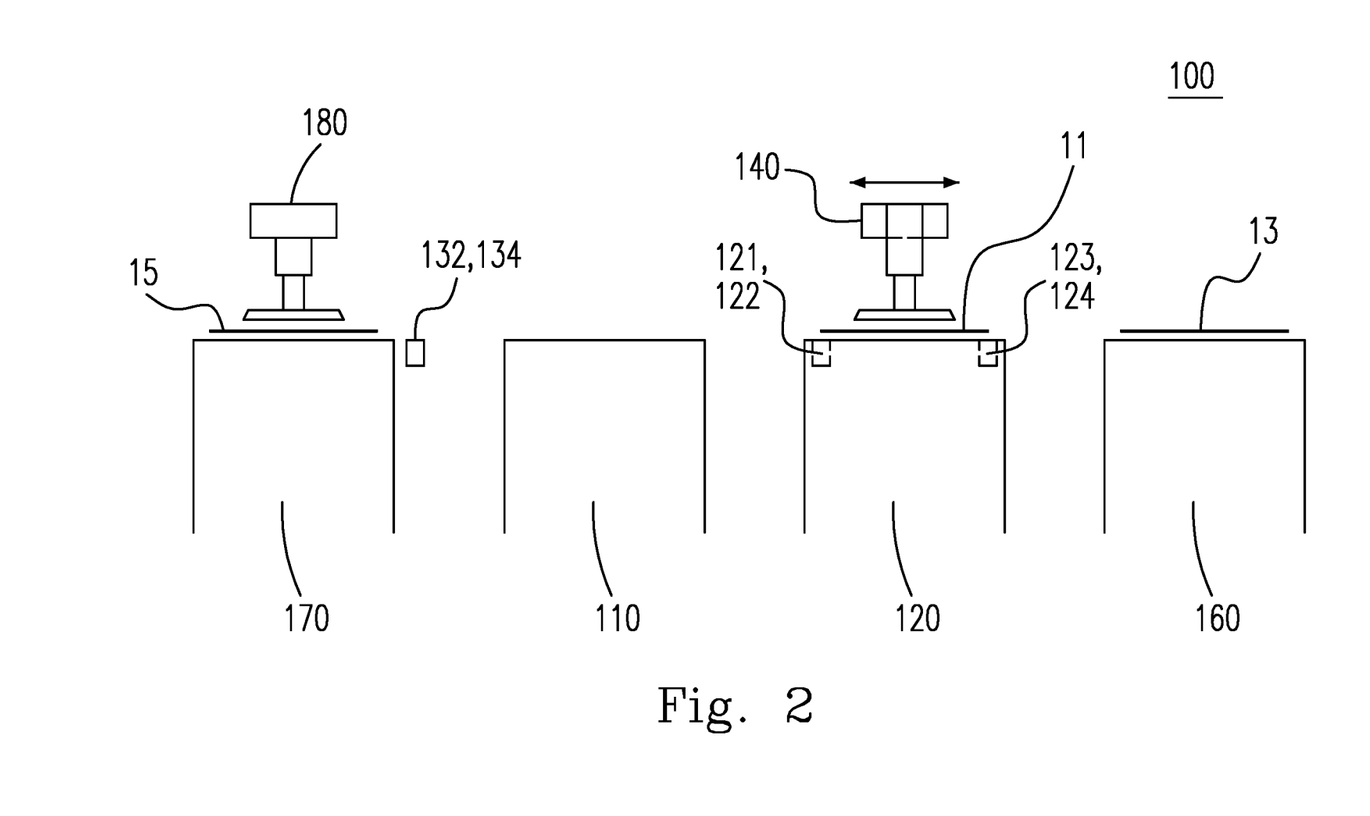
FIG. 2 is a schematic diagram showing a side view of the stacking and moving apparatus for manufacturing PCBs according to one embodiment of the present invention.
Figure 4:
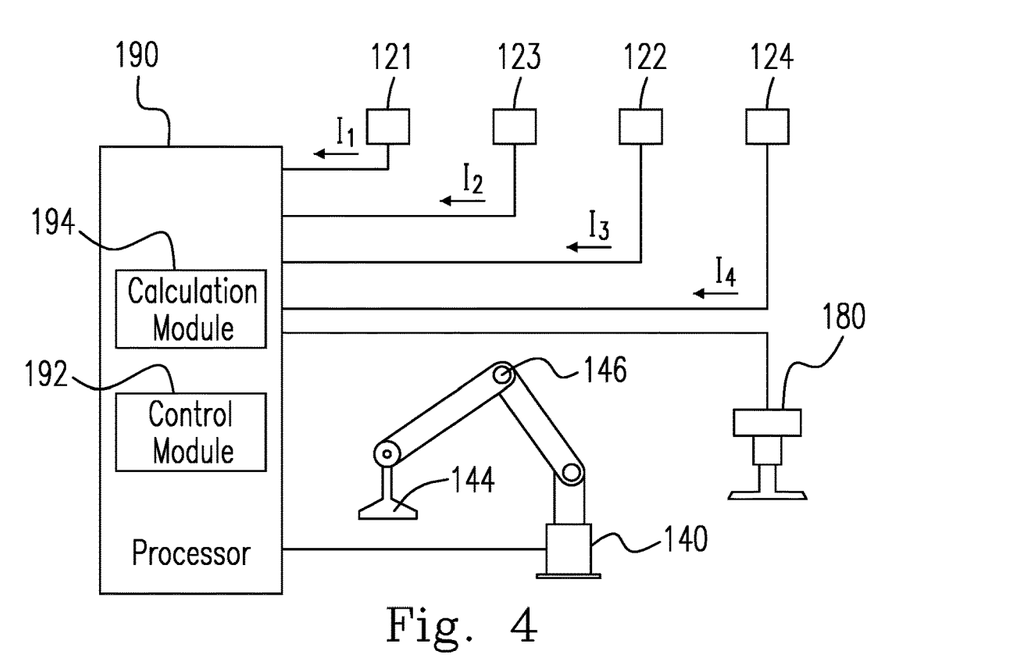
FIG. 4 is a schematic diagram showing a stacking and moving apparatus for manufacturing PCBs according to yet another embodiment of the present invention.

Please simultaneously refer to FIGS. 1 and 2. The stacking operation table 110 has a first side 112 and a second side 114. The first measuring table 120 is disposed adjacent to the first side of the stacking operation table 110, and is furnished with a first and a second image sensing elements 122, 124, such as image sensors, disposed at a pair of diagonal corners of the first measuring table 120. The illustration in FIG. 1 merely shows an example of the device layout according to the present invention. The first and the second image sensing elements 122, 124 can also be disposed on the other pair of diagonal corners, according to another embodiment of the present invention. When the first insulating material 11 or the second insulating material 13 is transported to the first measuring table 120, the first and the second image sensing elements 122, 124 can perform image collection for the insulating material 11 or 13 on the first measuring table 120 simultaneously to obtain a first and a second image data I1, I2 as shown in FIG. 4 respectively. Due to the softness of the material property, the insulating materials 11, 13 need to be fully laid down on the first measuring table 120, so as to allow the first and the second image sensing elements 122, 124 to collect images at the correct locations. It is appreciated that, from the illustration of FIG. 1, the first and second image data I1, I2 obtained by the first and the second image sensing elements 112, 124 respectively are related to the images at the corresponding corner areas of the first or the second insulating materials 11, 13.

Having the outer contour of a rectangular shape, the virtual profile of the first or the second insulating materials 11, 13, such as the lengths of the four sides and so on, can be determined by calculating for the directions and positions of two adjacent sides at each of the pairs of diagonal corners of the rectangular shape. Thus, the placing location for the first or the second insulating materials 11, 13 on the stacking operation table 110 can be determined based on the virtual profile of the first or the second insulating materials 11, 13. Taking the illustration in FIG. 1 as an example, the dotted lines show the determined placing location, including the bottom side 11x, the left side 11y and the center point 11c, for the first insulating material 11 on the stacking operation table 110.

According to the aforementioned embodiment, after the first and the second image data I1, I2 are transmitted from the first and the second image sensing elements 122, 124 to the first transporting device 140, during the period that one insulating material, the first insulating material 11 for example, is transported from the first measuring table 120 to the stacking operation table 110, the first transporting device 140 can determine where the insulating material is to be disposed on a specific insulating material placing location on the stacking operation table based on the first and the second image data I1, I2.

For the purpose of image collecting to the substrate material 15, the stacking and moving apparatus 100 for manufacturing PCBs according to the present invention also includes the third and the fourth image sensing elements 132, 134 disposed adjacent to the second side 114 of the stacking operation table 110 and toward the direction perpendicular to the surface of the stacking operation table 110. In one embodiment, the third and the fourth image sensing elements 132, 134 perform image collection for a second pair of diagonal corners (not shown) of the substrate material 15 to obtain a third and a fourth image data respectively. The stacking and moving apparatus 100 for manufacturing PCBs according to the present invention further includes a second transportation device 180, for example an automated moving device such as a robot or the like, to transport the substrate material 15 from the substrate material storage location 170 to the stacking operation table 110 while passing over the third and the fourth image sensing elements 132, 134. According to one embodiment of the present invention, the second transportation device 180 can also have a sucker (not shown) which can attach the transporting device 180 to the substrate material 15 by means of a vacuum device.

Notably, the substrate material 15 includes metal conductive layers which possess a certain rigidity, and thus the outer shape thereof will not deform during the transportation process. The third and the fourth image sensing elements 132, 134 can perform image collection for the second pair of diagonal corners of the substrate material 15 to obtain the third and the fourth image data I3, I4 illustrated in FIG. 4 at a different time when the substrate material 15 is transported over the third and the fourth image sensing elements 132, 134, without the need to let the substrate material 15 to be displaced on a measuring table. This can enhance operational efficiency.

Likewise, with an outer contour of a rectangular shape, the virtual profile of the substrate material 15 such as the lengths of the four sides and so on, can be determined by calculating for the directions and positions of two adjacent sides at each of the pairs of diagonal corners of the rectangular shape. Thus, the placing location for the substrate material 15 on the stacking operation table 110 can be determined based on the virtual profile of the substrate material 15. After the third and the fourth image data I3, I4 are transmitted from third and the fourth image sensing elements 132, 134 to the second transporting device 180, during the period that the substrate material 15 is transported to the stacking operation table 110, the second transporting device 180 can determine where the substrate material is to be disposed on a specific location on the stacking operation table based on the third and the fourth image data I3, I4.

Again, referring to FIG. 1, the stacking and moving apparatus 100 further includes a hot pressing table 150 disposed near the third side 116 of the stacking operation table 110 and different from the first and the second sides 112, 114. The hot pressing table 150 is configured to receive a stack 17 formed of the first and the second insulating materials 11, 13 and the substrate material 15. The above-mentioned operation process can be repeated until the end product of a printed circuit board is formed.

Figure 3:
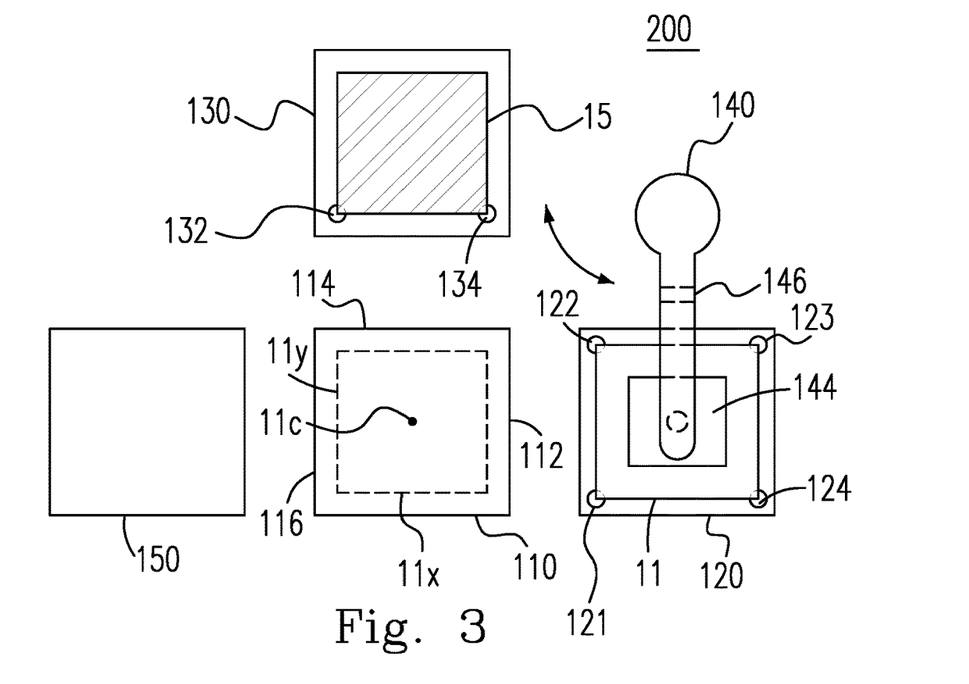
FIG. 3 is a schematic diagram showing a stacking and moving apparatus for manufacturing PCBs according to another embodiment of the present invention.

Please refer to FIG. 3, which is a schematic diagram showing a stacking and moving apparatus 200 for manufacturing PCBs according to another embodiment of the present invention. The stacking and moving apparatus 200 for manufacturing PCBs comprises a stacking operation table 110 having a first side 112 and a second side 114, a first measuring table 120 disposed adjacent to the first side 112 of the stacking operation table 120 and having a first sensing element 122 and a second image sensing element 124 disposed at a pair of diagonal corners of the first measuring table 120, a second measuring table 130 disposed adjacent to the second side 114 of the stacking operation table 110 and having a third image sensing element 132 and a fourth sensing element 134 disposed along the same side at the second measuring table 130 adjacent to the second side 114 of the stacking operation table 110 and a first transporting device 140. The first transporting device 140, such as a robot, is movably disposed on a location higher than the stacking operation table 110, the first measuring table 120, and the second measuring table 130 to transport the insulating material 11 to the first measuring table 120 and then to the stacking operation table 110. The first transporting device 140 has a joint 146 to allow the sucker 114 to be more flexibly handled. According to the layout as shown in FIG. 3, the first transporting device 140 can also configured to transport the substrate material 15 to the second measurement table 130 and then to the stacking operation table 110.

In addition to the first and the second image sensing elements 122, 124, in one embodiment, the first measuring table 120 in FIG. 3 further includes a fifth sensing element 121 and a sixth sensing element 123 disposed at the other pair of diagonal corners. In this embodiment, image collecting can be performed simultaneously at the four corners of the first insulating material 11 or the second insulating material 13 so as to obtain more sufficient data for use to more accurately estimate the profile of the first insulating material 11 or the second insulating material 13. Notably, the image sensing elements 121-124 and 132, 134 are charged coupled device (CCD) in general, which can transfer image data into electronic signals for the need of subsequent analysis.

Please refer to FIGS. 1-4 and 8, the stacking and moving apparatus 100/200 according to the present invention can also include a processor 190 electrically connected to the first, the second, the fifth and the sixth image sensing elements 122, 124, 121, 123 and the first and the second transporting devices 140, 180. In one embodiment, the stacking operation table 110 can be used for stacking the sheet materials having substantially rectangular shapes, such as the first and the second insulating materials 11, 13 and the substrate material 15 placed thereon.

Figure 8:
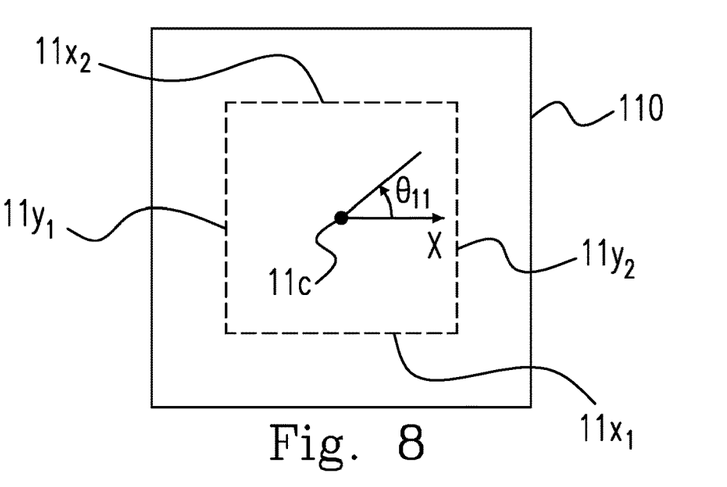
FIG. 8 is a schematic diagram showing some location parameters relevant to the locations for the first insulating material to be placed on the stacking operation table according to one embodiment of the present invention.

The processor 190 includes a calculation module 192 and a control module 194. Under the control of the processor 190, the first, the second, the fifth and the sixth image sensing elements 122, 124, 121, 123 perform image collection for the sheet materials such as the insulating materials 11, 13 or the substrate material 15 to obtain a first, a second, a third and a fourth image data I1, I2, I3 and I4 respectively, and the first, the second, the third and the fourth data I1, I2, I3 and I4 are transmitted to the processor 190. The calculation module 192 calculates to obtain position parameters for the sheet materials to be placed on the stacking operation table 110, for example the parameters θ11, 11c, 11x1, 11x2, 11y1 and 11y2 of the insulating material 11 based on a pair of the image data (the first and the second image data I1, I2 or the third and the fourth image data I3, I4). Afterwards, the control module 194 instructs the first transporting device 140 or the second transporting device 180 to place the sheet materials on the stacking operation table 110 according to the position parameters.

FIG. 8 shows some location parameters relevant to the locations for the first insulating material 11 to be placed on the stacking operation table 110. Parameters relevant to the first insulating material placing location include, but are not limited to, the orientation angle θ11 to the transverse axis X of the stacking operation table 110, the center point 11c and the four sides 11x1, 11x2, 11y1, 11y2 of the first insulating material 11. The skilled person in the art can realize the parameters relevant to the location for the second insulating material 13 or the substrate material 15 to be placed on the stacking operation table 110 based on the same concept.

Figure 5:
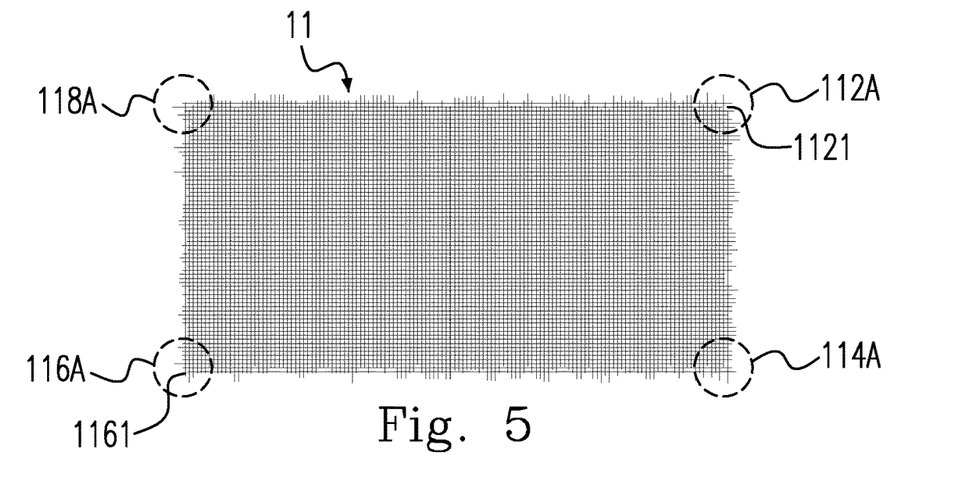
FIG. 5 is a schematic top view of an insulating material formed of longitudinal and transverse linear elements.

Please refer to FIG. 5, which shows a top view of an insulating material such as the first insulating material 11 formed of longitudinal and transverse linear elements. According to FIG. 5, the first insulating material 11 has a rectangular shape with a longitudinal direction, a transverse direction and four corner areas 112A, 114A, 116A, 118A. Taking a pair of diagonal areas 112A, 116A at the lower left and the upper right locations respectively as an example, one may obtain the first image I1 and the second image I2 by respectively using the fifth image sensing element 121 and the sixth image sensing element 123 as illustrated in FIG. 3.

Figure 6:
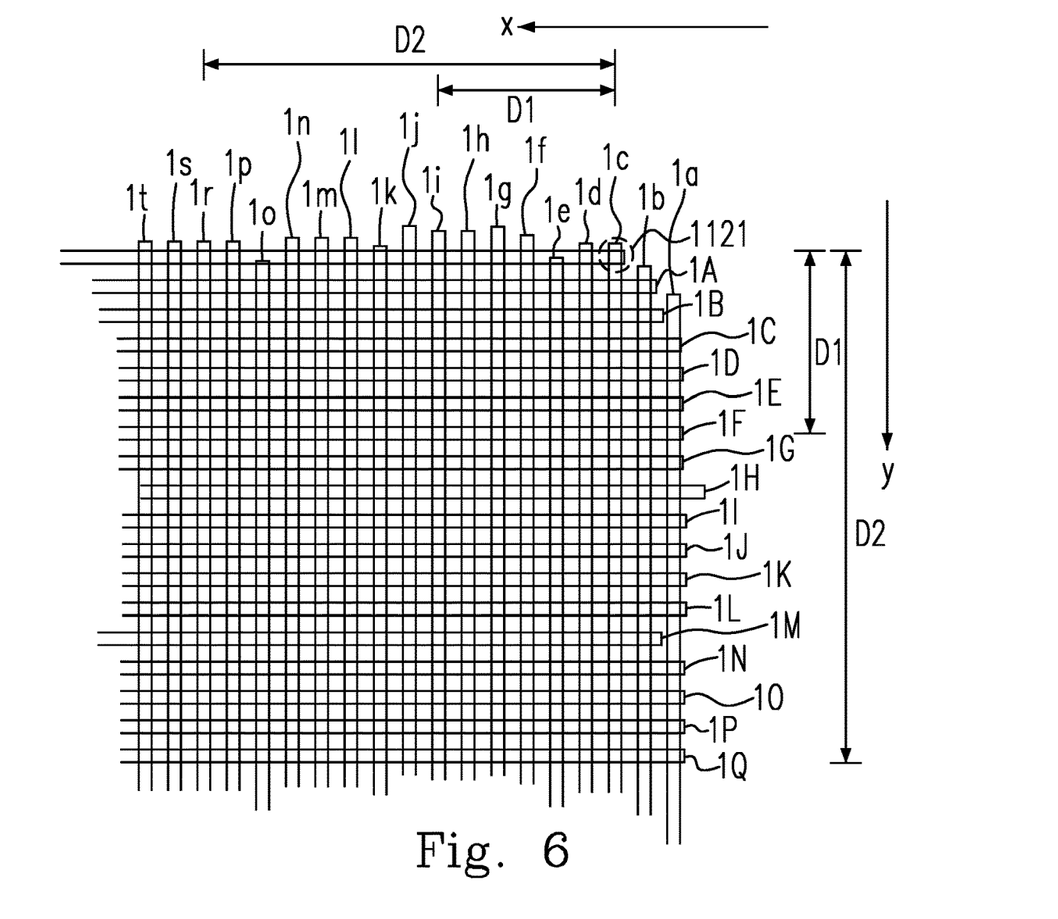
FIG. 6 is a schematic diagram showing the upper right corner of the insulating material in FIG. 5.

Please refer to FIG. 6, which shows an enlarged diagram of the upper right corner area 112A of the first insulating material 11 in FIG. 5. It can be understood from the illustration of FIG. 6, the first insulating material 11 is formed of a plurality of longitudinal and a plurality of transverse linear elements such as glass fibers crossed with each other. The present invention uses the end-point positions of the fibers or linear elements in the insulating material to estimate the outer contour of the insulating material. However, after the processes of cutting and transportation, the outer contour of the insulating material near the corner areas might be irregular for the damage due to unexpected forces. In addition, the directions of the cutting edges of the sheet-like insulting material and that of the fiber-like linear elements are not necessary to be perfectly parallel or perpendicular to each other. Therefore, appropriate end-point locations need to be selected as reference while excluding the ones which may easily cause errors when estimating the outer contour, for instance the four sides, of the rectangular sheet-like insulating material.

In one embodiment of the present invention, one may first to determine the first corner location 1161 and the second corner location 1121 from the first and the second images I1, I2 respectively, and then to select end-point positions located at appropriate distance from the corner locations 1121, 1161 as the reference locations to estimate each sides of the outer contour. The outer contour can be a virtual contour simulated by a computer software, and can be used to determine the appropriate location for the first insulating material 11 to be placed on the stacking operation table 110, such as the illustration shown in FIG. 8.

One can see longitudinal direction y and transverse direction x on the plane as illustrated in FIG. 6. The positions of the image sensing elements 121-124 are predetermined on the first measuring table 120, and the process 190 can identify the relative positions of each of the end-points from the images I1-I4. For example, in the corner area 112A, the longitudinal end-points near the second corner location 1121 are denoted by 1a, 1b . . . and 1t while the transverse end-points near the second corner location 1121 are denoted by 1A, 1B . . . and 1Q. Based on the concept set forth above, once the second corner location 1121 has been determined, one may select a set of longitudinal end-point positions 1i, 1j, 1k, 1l, 1m, 1n, 1o, 1p along the y direction and a set of transverse end-point positions 1F, 1G, 1I, 1J, 1K, 1L, 1M, 1N, 1O, 1P, 1Q along the x direction within a range between two specific distances from the first corner location such as the first specific distance D1 and the second specific distance D2 to be used for estimating the location of the sides near the upper right corner area 112A of the first insulating material 11. The first specific distance D1 and the second specific distance D2 can be chosen based on one's experience, for example, 1 cm or half inch for D1 and 2-3 cm or one inch for D2. A user may determine the specification of D1 and D2 based on the image size of the images obtained by the image sensing elements.

Figure 7:
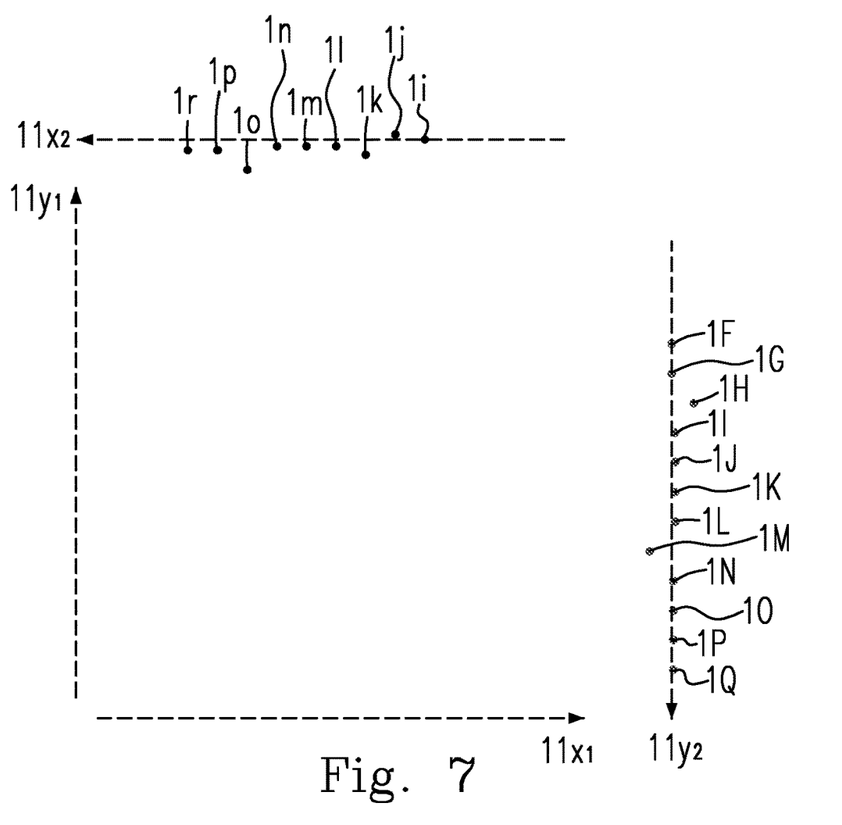
FIG. 7 is a schematic diagram showing an exemplary embodiment of estimating the virtual contour of a material composed of longitudinal and transverse line elements according to the present invention.

Please refer to FIG. 7, which schematics the method of estimating the virtual contour of a material composed of longitudinal and transverse line elements according to an embodiment of the present invention. The set of longitudinal end-point positions 1i, 1j, 1k, 1l, 1m, 1n, 1o, 1p and the set of transverse end-point positions 1F, 1G, 1I, 1J, 1K, 1L, 1M, 1N, 1O, 1P, 1Q are the same as those in FIG. 6. Having obtained the data regarding those end-point positions, the calculation module 192 of the processor 190 can estimate the locations of the first transverse side 11x2 and the first longitudinal side 11y2 based on that information. It is appreciated by the skilled person in the art that locations of the second transverse side 11x1 and the second longitudinal side 11y1 can be estimated based on the end-point locations near the first corner location 1161 in the corner area 116A according to the abovementioned methodology, and the virtual contour of the first insulating material 11 can therefore be determined based on the first and second transverse sides 11x2, 11x1 and the first and the second longitudinal sides 11y2, 11y1.

According to one embodiment of the present invention, the location of the first transverse side 11x2 can be determined based on the set of transverse end-point positions 1i, 1$j$, 1$k$, 1$l$, 1$m$, 1$n$, 1$o$, 1$p$ using a regression method such as linear regression. Likewise the location of the first longitudinal side 11$y$2 can also be determined by the same method. There are a variety of regression methods such as polynomial regression or logistic regression in the field of Mathematics. Because each side of a rectangular shape is a straight line, the linear regression should be the most effective regression method to be adopted for the present invention. There are some other methods of estimating the position of a straight line passing some known positions such as the least square method or other methods. When the direction or slope of the line to be estimated is known, the least square method can be used to determine the most likely position of the line, which can be the simulated virtual location of a side.

In FIGS. 6 and 7, one may observe that the location of the longitudinal end-points 1$k$ and 1$o$ are relatively lower than that of the other adjacent longitudinal end-points, which implies that the two end-points might be outliers. It can be understood that the estimating result for the location of the first transverse side 11$x$2 could be lower due to the outliers if data regarding the location of the longitudinal end-points 1$k$ and 1$o$ are taken into account. In one embodiment of the present invention, one may choose to exclude any data which is suspected of being an outlier before performing the estimation. The outlier can be identified by using an analysis of variation, according to one embodiment of the present invention. For example, one may choose to calculate the distances of the locations from each of the set of longitudinal end-point positions 1$i$, 1$j$, 1$k$, 1$l$, 1$m$, 1$n$, 1$o$, 1$p$ to the estimated location of the first longitudinal side 11$x$2 calculated based on all the end-point positions, estimate the variation and standard deviation of the distances, and verify if there is any outlier existing outside the limit of two or three standard deviations from the estimated location. After the outliers are identified, the calculation for the position of the estimated location of the side will be repeated but excluding data of the outliers.

Likewise, the transverse end-points 1H and 1M could be outliers among the set of transverse end-points 1F, 1G, 1I, 1J, 1K, 1L, 1M, 1N, 1O, 1P, 1Q. The method of analysis of variation can be also adopted for identifying any outliers, and the estimated location of the first longitudinal side 11$y$2 can be calculated based on the data excluding any outliers.

FIG. 8 is a schematic diagram showing some location parameters relevant to the locations for the first insulating material 11 to be placed on the stacking operation table 110 according to one embodiment of the present invention. The same concepts can also be applied for determining the placement location of the second insulating material 13 or the substrate material 15 on the stacking operation table 110. Having determined the locations of the first transverse side 11$x$2, the first longitudinal side 11$y$2, the second transverse side 11$y$2 and the second longitudinal side 11$y$1 of the first insulating material 11, the virtual contour thereof such as the central point 11$c$ and the relative location as well as the length of each of the sides 11$x$1, 11$x$2, 11$y$1, 11$y$2 can be determined simply based on geological relationship therebetween. In addition, parameters of the virtual contour of the first insulating material 11 can also include the orientation angle θ11 to the transverse axis X of the stacking operation table 110. During the process when the first transporting device 140 moves the first insulating material 11 from the first measuring table 120 to the stacking operation table 110, the orientation angle has to be adjusted so that the virtual contour can be aligned with the bottom side 11$x$ and the left side 11$y$ of the determined placing location for the first insulating material 11 on the stacking operation table 110 as shown in FIGS. 1 and 3.

Figure 9:
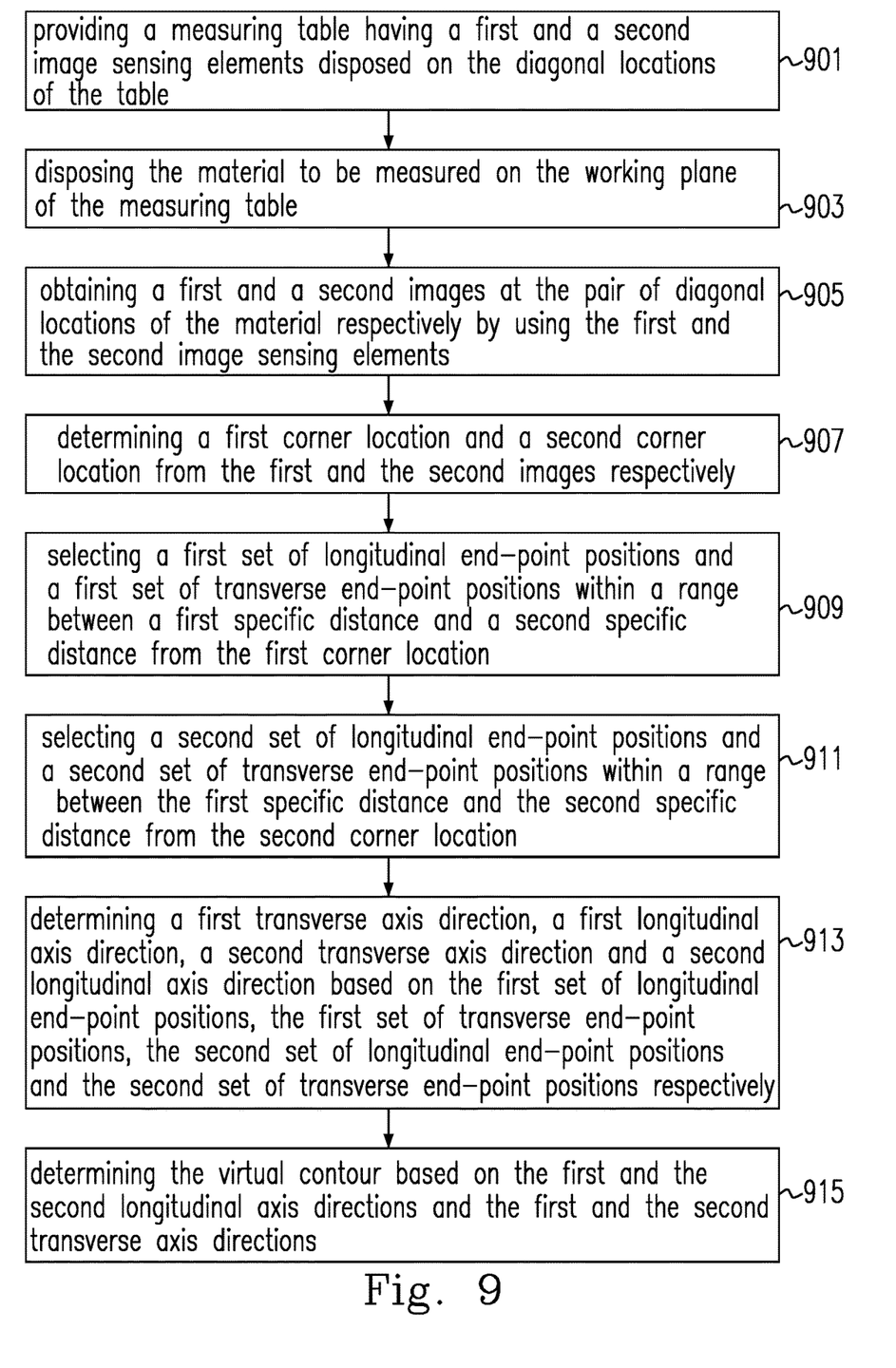
FIG. 9 is a flow diagram showing the method of estimating the virtual contour of a sheet material formed of longitudinal and transverse linear elements according to one embodiment of the present invention.

Please refer to FIG. 9, which shows an embodiment of the method of estimating a virtual contour of a sheet material formed of longitudinal and transverse linear elements, wherein the material has a rectangular shape with a longitudinal direction and a transverse direction and a pair of diagonal locations. The sheet material can be a prepreg material which is composed of a plurality of crossed glass fibers and to be used for an insulating material in a multi-layered printed circuit board. According to FIG. 9, the method comprises the following steps: providing a measuring table having a first and a second image sensing elements disposed on the diagonal locations of the table (Step 901); disposing the material to be measured on the working plane of the measuring table (Step 903); obtaining a first and a second images at the pair of diagonal locations of the material respectively by using the first and the second image sensing elements (Step 905); determining a first corner location and a second corner location from the first and the second images respectively (Step 907); selecting a first set of longitudinal end-point positions and a first set of transverse end-point positions within a range between a first specific distance and a second specific distance from the first corner location (Step 909); selecting a second set of longitudinal end-point positions and a second set of transverse end-point positions within a range between the first specific distance and the second specific distance from the second corner location (Step 911); determining a first transverse axis direction, a first longitudinal axis direction, a second transverse axis direction and a second longitudinal axis direction based on the first set of longitudinal end-point positions, the first set of transverse end-point positions, the second set of longitudinal end-point positions and the second set of transverse end-point positions respectively (Step 913); and determining the virtual contour based on the first and the second longitudinal axis directions and the first and the second transverse axis directions (Step 915). The virtual contour includes parameters such as the central point 11$c$, the relative location as well as the length of each of the longitudinal or transverse sides and a rotation angle (the abovementioned orientation angle θ11 for example).

Notably, one may choose to use appropriate filters adapted on the lens of the image sensing elements 132, 134 to make it easier for the identifying of the edges when employing the method of the present invention to estimate the virtual contour of the substrate material 15. The subsequent steps for estimating the virtual contour of a substrate material are similar to the aforementioned, and thus there is no need to repeat.

Through the embodiment set forth above, the methods of estimating the virtual contour of material formed of longitudinal and transverse linear elements can help the process in an automation system to accurately specify the location for the materials to be placed on the stack operation table during the transporting process, which can fulfill the need of highly efficient automatic manufacturing and should be a great technological innovation.

Embodiments

1. A method of estimating a virtual contour of an insulating material for manufacturing a multilayer circuit board, wherein the insulating material has a rectangular shape and a pair of diagonal locations, and is a prepreg material composed of a plurality of crossed glass fibers, the method comprising the following steps: obtaining a first and a second images at the pair of diagonal locations of the insulating material respectively; determining a first corner location and a second corner location from the first and the second images respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; determining a first transverse axis direction, a first longitudinal axis direction, a second transverse axis direction and a second longitudinal axis direction based on the first set of longitudinal end-point positions, the first set of transverse end-point positions, the second set of longitudinal end-point positions and the second set of transverse end-point positions respectively; and determining the virtual contour based on the first and the second longitudinal axis directions and the first and the second transverse axis directions.

2. The method in Embodiment 1, further comprising the following steps: providing a measuring table having diagonal locations, and a first and a second image sensing elements disposed on the diagonal locations thereof, wherein the first and the second image sensing elements are perpendicularly directed to a working plane of the measuring table; disposing the insulating material on the working plane; and using the first and the second image sensing elements to obtain the first and the second images respectively.

3. The method in Embodiment 1, wherein the first and the second sets of longitudinal end-point positions and the first and the second sets of transverse end-point positions include outlier ones.

4. The method in Embodiment 3, wherein the outlier ones are identified by employing an algorithm of variation analysis.

5. The method in Embodiment 1, wherein the first and the second transverse axis directions and the first and the second longitudinal axis directions are determined by a linear regression.

6. The method in Embodiment 1, wherein the virtual contour includes a longitudinal length, a transverse length and a plane rotating angle.

7. A method of placing a stacking material on a stacking table having a center location and a transverse axis direction, wherein the stacking material has a pair of diagonal locations, a virtual contour and a plane rotating angle, and the virtual contour has a center point, the method comprising the following steps: obtaining a first and a second images at the pair of diagonal locations of the stacking material respectively; selecting a first set of longitudinal end-point positions and a first set of transverse end-point positions within a range between a first specific distance and a second specific distance from a first corner location in the first image; selecting a second set of longitudinal end-point positions and a second set of transverse end-point positions within a range between the first specific distance and the second specific distance from a second corner location in the second image; determining a first transverse axis direction, a first longitudinal axis direction, a second transverse axis direction and a second longitudinal axis direction based on the first set of longitudinal end-point positions, the first set of transverse end-point positions, the second set of longitudinal end-point positions and the second set of transverse end-point positions respectively; determining the center point of the virtual contour and the plane rotating angle of the stacking material based on the first and the second longitudinal axis directions and the first and the second transverse axis directions; and placing the stacking material on the stacking table according to the center point of the virtual contour and the plane rotating angle, wherein the center point of the virtual contour is superimposed on the center location of the stacking table.

8. The method in Embodiment 7, wherein the first and the second images are obtained by using a first image sensor and a second image sensor respectively.

9. The method in Embodiment 7, wherein the stacking material is a prepreg material composed of a plurality of crossed glass fibers.

10. The method in Embodiment 7, wherein the first and the second sets of longitudinal end-point positions and the first and the second sets of transverse end-point positions include an outlier end-point position.

11. The method in Embodiment 10, wherein the outlier is identified by using an analysis of variation.

12. The method in Embodiment 7, wherein the first and the second transverse axis directions and the first and the second longitudinal axis directions are determined by a linear regression.

13. The method in Embodiment 7, wherein the method of placing the stacking material on the stacking table is implemented by using an automatic transporting device.

14. The method in Embodiment 13, wherein the automatic transporting device includes a mechanical arm.

15. A method of estimating a virtual contour of a sheet material formed of longitudinal and transverse linear elements, wherein the material has a rectangular shape with a longitudinal direction and a transverse direction and a pair of diagonal locations, the method comprising the following steps: obtaining a first and a second images at the pair of diagonal locations of the material respectively, wherein the first and the second images have a first and a second corner locations respectively; selecting a first set of longitudinal end-point positions and a first set of transverse end-point positions within a range between a first specific distance and a second specific distance from the first corner location; selecting a second set of longitudinal end-point positions and a second set of transverse end-point positions within a range between the first specific distance and the second specific distance from the second corner location; and determining four sides of the rectangular shape to form the virtual contour based on the first set of longitudinal end-point positions, the first set of transverse end-point positions, the second set of longitudinal end-point positions and the second set of transverse end-point positions.

16. The method in Embodiment 15, wherein the sheet material is a prepreg material composed of a plurality of crossed glass fibers.

17. The method in Embodiment 15, further comprising a step of: determining a center point of the virtual contour and a plane rotating angle based on the four sides of the rectangular shape.

18. The method in Embodiment 15, wherein the first and the second sets of longitudinal end-point positions and the first and the second sets of transverse end-point positions have an outlier end-point position.

19. The method in Embodiment 18, wherein the outlier is identified by using an analysis of variation.

20. The method in Embodiment 15, wherein the four sides of the rectangular shape are determined by a linear regression.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of estimating a virtual contour of an insulating material for manufacturing a multilayer circuit board, wherein the insulating material has a rectangular shape and a pair of diagonal locations, and is a prepreg material composed of a plurality of crossed glass fibers, the method comprising the following steps:
    obtaining a first and a second images at the pair of diagonal locations of the insulating material respectively;
    determining a first corner location and a second corner location from the first and the second images respectively;
    selecting a first set of longitudinal end-point positions and a first set of transverse end-point positions within a range between a first specific distance and a second specific distance from the first corner location;
    selecting a second set of longitudinal end-point positions and a second set of transverse end-point positions within a range between the first specific distance and the second specific distance from the second corner location;
    determining a first transverse axis direction, a first longitudinal axis direction, a second transverse axis direction and a second longitudinal axis direction based on the first set of longitudinal end-point positions, the first set of transverse end-point positions, the second set of longitudinal end-point positions and the second set of transverse end-point positions respectively; and
    determining the virtual contour based on the first and the second longitudinal axis directions and the first and the second transverse axis directions,
    wherein each of the end point positions of the first set of longitudinal end-point positions, the first set of transverse end-point positions, the second set of longitudinal end-point positions, and the second set of transverse end-point positions is an end point position of a fiber element of the plurality of crossed glass fibers.

2. The method as claimed in claim 1, further comprising the following steps:
    providing a measuring table having diagonal locations, and a first and a second image sensing elements disposed on the diagonal locations thereof, wherein the first and the second image sensing elements are perpendicularly directed to a working plane of the measuring table;
    disposing the insulating material on the working plane; and
    using the first and the second image sensing elements to obtain the first and the second images respectively.

3. The method as claimed in claim 1, wherein the first and the second sets of longitudinal end-point positions and the first and the second sets of transverse end-point positions include outlier ones.

4. The method as claimed in claim 3, wherein the outlier ones are identified by employing an algorithm of variation analysis.

5. The method as claimed in claim 1, wherein the first and the second transverse axis directions and the first and the second longitudinal axis directions are determined by a linear regression.

6. The method as claimed in claim 1, wherein the virtual contour includes a longitudinal length, a transverse length and a plane rotating angle.

7. A method of estimating a virtual contour of a sheet material formed of crossed longitudinal and transverse linear elements, wherein the material has a rectangular shape with a longitudinal direction and a transverse direction and a pair of diagonal locations, the method comprising the following steps:
    obtaining a first and a second images at the pair of diagonal locations of the material respectively, wherein the first and the second images have a first and a second corner locations respectively;
    selecting a first set of longitudinal end-point positions and a first set of transverse end-point positions within a range between a first specific distance and a second specific distance from the first corner location;
    selecting a second set of longitudinal end-point positions and a second set of transverse end-point positions within a range between the first specific distance and the second specific distance from the second corner location; and
    determining four sides of the rectangular shape to form the virtual contour based on the first set of longitudinal end-point positions, the first set of transverse end-point positions, the second set of longitudinal end-point positions and the second set of transverse end-point positions,
    wherein each of the end point positions of the first set of longitudinal end-point positions, the first set of transverse end-point positions, the second set of longitudinal end-point positions, and the second set of transverse end-point positions is an end point position of a fiber element of the crossed longitudinal and transverse linear elements.

8. The method as claimed in claim 7, wherein the sheet material is a prepreg material composed of a plurality of crossed glass fibers.

9. The method as claimed in claim 7, further comprising a step of:
    determining a center point of the virtual contour and a plane rotating angle based on the four sides of the rectangular shape.

10. The method as claimed in claim 7, wherein the first and the second sets of longitudinal end-point positions and the first and the second sets of transverse end-point positions have an outlier end-point position.

11. The method as claimed in claim 10, wherein the outlier is identified by using an analysis of variation.

12. The method as claimed in claim 7, wherein the four sides of the rectangular shape are determined by a linear regression.

* * * * *